(12) United States Patent
Adamczyk et al.

(10) Patent No.: US 8,111,816 B2
(45) Date of Patent: Feb. 7, 2012

(54) METHODS AND SYSTEMS FOR ENABLING RETURN TO SAME POSITION IN A REVIEW OF MESSAGES IN A VOICE MAIL SYSTEM USING TAG OR IDENTIFIER STORED IN THE VOICE MAIL SYSTEM

(75) Inventors: Maria Adamczyk, Alpharetta, GA (US); Joel Brand, Danville, CA (US); Robert E. Braudes, Danvers, MA (US)

(73) Assignee: AT&T Intellectual Property I, L.P., Reno, NV (US)

( * ) Notice: Subject to any disclaimer, the term of this patent is extended or adjusted under 35 U.S.C. 154(b) by 1038 days.

(21) Appl. No.: 12/026,335

(22) Filed: Feb. 5, 2008

(65) Prior Publication Data

US 2008/0187113 A1    Aug. 7, 2008

Related U.S. Application Data

(63) Continuation of application No. 10/923,655, filed on Aug. 20, 2004, now Pat. No. 7,327,835, which is a continuation of application No. 09/914,388, filed as application No. PCT/US00/04766 on Feb. 25, 2000, now Pat. No. 6,891,931.

(60) Provisional application No. 60/121,932, filed on Feb. 26, 1999.

(51) Int. Cl.
  *H04M 1/64* (2006.01)
(52) U.S. Cl. .......................... 379/88.23; 379/69
(58) Field of Classification Search ............... 379/88.23, 379/69
  See application file for complete search history.

(56) References Cited

U.S. PATENT DOCUMENTS

| | | |
|---|---|---|
| 4,930,152 A | 5/1990 | Miller |
| 4,933,967 A | 6/1990 | Lo et al. |
| 5,058,152 A | 10/1991 | Solomon et al. |

(Continued)

FOREIGN PATENT DOCUMENTS

EP          025 5325 A2    2/1988

(Continued)

OTHER PUBLICATIONS

Bosco; "Voice Services on the Intelligent Network: Intelligent Peripherals and Service Nodes", XP-000607359, Aug. 1992, 4 pages.

(Continued)

*Primary Examiner* — Joseph T Phan
(74) *Attorney, Agent, or Firm* — Thomas, Kayden, Horstemeyer & Risley, LLP

(57) ABSTRACT

Methods and systems for enabling a subscriber to interrupt a review of messages in a voice mail system (VMS), to make a call or take some other action, and to return to the same position as occupied at the time of interruption in the review of messages in the VMS. In response to an indication from the subscriber's communication to leave the review, an identifier is created to mark the position of the subscriber's communication in the review. The identifier is stored in the VMS. The VMS transmits a release message with respect to the subscriber's communication, the message including a copy of the identifier. The message may be a GR-1120 message including a remote operations (RO) parameter with the copy of the identifier. In response to the release message, a service control point (SCP) stores the copy of the identifier and causes whatever action is indicated in the message to be taken with respect to the subscriber's communication. In response to the receipt of the release message from a network element other than the VMS, the SCP routes the subscriber's communication including the copy of the identifier to the VMS. The VMS uses the copy of the identifier with the identifier to place the subscriber's communication in the same position occupied previously in the review.

4 Claims, 4 Drawing Sheets

U.S. PATENT DOCUMENTS

| | | | |
|---|---|---|---|
| 5,353,331 A | 10/1994 | Emery et al. | |
| 5,361,295 A | 11/1994 | Solomon et al. | |
| 5,425,091 A | 6/1995 | Josephs | |
| 5,493,604 A | 2/1996 | Hirayama | |
| 5,493,607 A | 2/1996 | Arumainayagam et al. | |
| 5,521,969 A | 5/1996 | Paulus et al. | |
| 5,572,583 A | 11/1996 | Wheeler et al. | |
| 5,668,863 A * | 9/1997 | Bieselin et al. | 379/202.01 |
| 5,680,442 A | 10/1997 | Bartholomew et al. | |
| 5,684,862 A | 11/1997 | Finnigan | |
| 5,692,033 A | 11/1997 | Farris | |
| 5,712,903 A | 1/1998 | Bartholomew et al. | |
| 5,717,742 A | 2/1998 | Hyde-Thomson | |
| 5,732,216 A * | 3/1998 | Logan et al. | 709/203 |
| 5,740,230 A | 4/1998 | Vaudreuil | |
| 5,740,231 A | 4/1998 | Cohn et al. | |
| 5,742,763 A | 4/1998 | Jones | |
| 5,742,769 A | 4/1998 | Lee et al. | |
| 5,742,905 A | 4/1998 | Pepe et al. | |
| 5,764,747 A | 6/1998 | Yue et al. | |
| 5,768,348 A | 6/1998 | Solomon et al. | |
| 5,790,637 A | 8/1998 | Johnson et al. | |
| 5,812,639 A | 9/1998 | Bartholomew et al. | |
| 5,812,670 A | 9/1998 | Micali | |
| 5,832,072 A | 11/1998 | Rozenblit | |
| 5,832,221 A | 11/1998 | Jones | |
| 5,838,768 A | 11/1998 | Sumar et al. | |
| 5,848,132 A | 12/1998 | Morley et al. | |
| 5,905,774 A | 5/1999 | Tatchell et al. | |
| 5,922,045 A * | 7/1999 | Hanson | 709/206 |
| 5,930,479 A | 7/1999 | Hall | |
| 5,940,478 A | 8/1999 | Vaudreuil et al. | |
| 6,005,845 A | 12/1999 | Svennesson et al. | |
| 6,064,723 A | 5/2000 | Cohn et al. | |
| 6,148,069 A | 11/2000 | Ekstrom et al. | |
| 6,169,795 B1 | 1/2001 | Dunn et al. | |
| 6,185,527 B1 | 2/2001 | Petkovic et al. | |
| 6,199,076 B1 * | 3/2001 | Logan et al. | 715/203 |
| 6,209,100 B1 | 3/2001 | Robertson et al. | |
| 6,226,359 B1 | 5/2001 | Montgomery et al. | |
| 6,233,318 B1 | 5/2001 | Picard et al. | |
| 6,243,374 B1 | 6/2001 | White et al. | |
| 6,298,129 B1 | 10/2001 | Culver et al. | |
| 6,301,349 B1 | 10/2001 | Malik | |
| 6,317,484 B1 | 11/2001 | McAllister | |
| 6,330,079 B1 | 12/2001 | Dugan et al. | |
| 6,339,640 B1 | 1/2002 | Chen et al. | |
| 6,625,261 B2 * | 9/2003 | Holtzberg | 379/88.23 |
| 6,782,089 B1 * | 8/2004 | Blackburn et al. | 379/212.01 |
| 6,876,729 B1 * | 4/2005 | Kuter et al. | 379/88.22 |
| 6,891,931 B1 * | 5/2005 | Adamczyk et al. | 379/69 |
| 7,191,213 B1 * | 3/2007 | Bouchard et al. | 709/204 |
| 7,272,213 B2 * | 9/2007 | Holtzberg | 379/88.25 |
| 7,327,835 B2 * | 2/2008 | Adamczyk et al. | 379/88.23 |
| 7,564,956 B2 * | 7/2009 | Holtzberg | 379/88.25 |
| 7,650,621 B2 * | 1/2010 | Thomas et al. | 725/87 |
| 7,689,510 B2 * | 3/2010 | Lamkin et al. | 705/51 |
| 7,779,097 B2 * | 8/2010 | Lamkin et al. | 709/223 |
| 7,917,933 B2 * | 3/2011 | Thomas et al. | 725/88 |
| 8,019,059 B2 * | 9/2011 | Holtzberg | 379/88.25 |

FOREIGN PATENT DOCUMENTS

| | | |
|---|---|---|
| EP | 025 5325 A3 | 2/1988 |
| EP | 041 2799 A2 | 2/1991 |
| EP | 041 2799 A3 | 2/1991 |
| EP | 05 07 125 A2 | 3/1992 |
| EP | 050 7125 A3 | 7/1992 |
| EP | 054 3235 A2 | 5/1993 |
| EP | 054 3235 A3 | 5/1993 |
| EP | 062 4967 A1 | 11/1994 |
| EP | 066 2762 A2 | 7/1995 |
| EP | 078 2304 A2 | 2/1997 |
| EP | 078 2315 A2 | 2/1997 |
| EP | 078 2316 A2 | 2/1997 |
| EP | 081 3162 A2 | 12/1997 |
| EP | 082 5752 A2 | 2/1998 |
| EP | 084 1796 A2 | 5/1998 |
| EP | 084 3453 A2 | 5/1998 |
| EP | 088 6228 A2 | 12/1998 |
| EP | 084 1796 A3 | 8/1999 |
| WO | WO 00/51327 | 8/2000 |
| WO | WO 97/08901 | 8/2000 |

OTHER PUBLICATIONS

Transactions in Intelligent Networks;, XP-002141947, 1998, 92 pages.

"Die T-Net-Box- der Anrufbeantworter im Netz", XP- 000861610, 1998, pp. 1-8.

"General Recommendations on Telephone Switching and Signalling- Introduction to Intelligent Network Capability Set 1", International Telecommunication Union, XP- 002141945, Mar. 1993, 28 pages.

Anderl; "An Enhanced Message Newtworking Topology; Multimedia Messaging with the Intuity (TM) Interchange Server", Bell Labs Technical Journal, Apr.-Jun. 1998, pp. 124-135.

"The Belcore and ITU- T Call Model Operations", XP- 002141946, 1998, 24 pages.

International Search Report PCT/US00/05002 filed Feb. 25, 2000, pp. 1-4.

Adamczyk; U.S. Appl. No. 09/914,388, filed Jan. 24, 2002.

Adamaczyk; U.S. Appl. No. 09/513,004, filed Feb. 25, 2000.

Adamczyk; U.S. Appl. No. 09/696,725, filed Oct. 25, 2000.

Adamczyk; U.S. Appl. No. 10/923,655, filed Aug. 20, 2004.

Adamczyk; Non-Final Rejection mailed Aug. 6, 2003; U.S. Appl. No. 09/914,388, filed Jan. 24, 2002.

Adamczyk; Final Rejection mailed Apr. 30, 2004; U.S. Appl. No. 09/914,388, filed Jan. 24, 2002.

Adamczyk; Notice of Allowance and Fees Due mailed Sep. 13, 2004; U.S. Appl. No. 09/914,388, filed Jan. 24, 2002.

Adamaczyk; Non-Final Rejection mailed Jan. 12, 2007; U.S. Appl. No. 10/923,655, filed Aug. 20, 2004.

Adamaczyk; Examiner Interview Summary Record mailed Apr. 23, 2007; U.S. Appl. No. 10/923,655, filed Aug. 20, 2004.

Adamaczyk; Final Rejection mailed Jul. 2, 2007; U.S. Appl. No. 10/923,655, filed Aug. 20, 2004.

Adamaczyk; Notice of Allowance and Fees Due mailed Oct. 5, 2007; U.S. Appl. No. 10/923,655, filed Aug. 20, 2004.

* cited by examiner

METHODS AND SYSTEMS FOR ENABLING RETURN TO SAME POSITION IN A REVIEW OF MESSAGES IN A VOICE MAIL SYSTEM USING TAG OR IDENTIFIER STORED IN THE VOICE MAIL SYSTEM

CROSS-REFERENCE TO RELATED APPLICATIONS

This application is a continuation of U.S. application Ser. No. 10/923,655, filed Aug. 20, 2004, issued on Feb. 5, 2008 as U.S. Pat. No. 7,327,835, which is a continuation of U.S. application Ser. No. 09/914,388, filed Jan. 24, 2002, issued on May 10, 2005 as U.S. Pat. No. 6,891,931, which was the National Stage of International Application No. PCT/US00/04766, filed Feb. 25, 2000, which claims the benefit of U.S. Provisional Application No. 60/121,932, filed Feb. 26, 1999, all of which are incorporated herein by reference in their entireties.

FIELD OF THE INVENTION

The present inventions related to the field of telecommunications, and particularly, relate to the use of voice messaging systems in an Advanced Intelligent Network (AIN) of a communications system.

BACKGROUND

A person typically uses a telephone answering machine or a voice mail service to provide a caller with an opportunity to leave a message should the person be unavailable to take the call. On a busy day, a number of messages may be accumulated and made available for retrieval. As the person goes through the accumulated messages, he or she may simply listen to some of the messages. For other messages, the person may desire to speak directly to the callers in "live calls to the callers". In other words, the person may desire to make a reply call to one of the callers who left the person a message.

There are different ways in which a person may make a reply call to a caller who left a message such as the method referred to herein as the "urgent-reply". Pursuant to the urgent-reply method, the reply call is made as soon after listening to the relevant message as desired. For example, a caller may have left an urgent message for the person. As soon as the person gathers the urgency of the message and the relevant callback information, the person may initiate the reply call. In other words, the person interrupts his or her review of messages to make the "urgent-reply". Generally, if the person interrupts his or her review of messages, (such as to make an "urgent-reply"), the person misses the rest of his or her messages. To review those missed messages, some systems require the person to call back into the system and to repeat a review of previously reviewed messages.

Systems that require a person to call back into a voice mail system and repeat a review of messages are frustrating to some subscribers because they delay the subscribers' retrieval of missed messages. In these frustrating systems, the person calls back into the system, and if the person has not erased or otherwise taken care of the reviewed messages, the person must listen through or at least skip through the reviewed messages to get to the missed or unread messages. Such a frustrated subscriber much prefers to return to the VMS and pick up where he or she left off by skipping the reviewed messages and proceeding directly to the missed or unread messages.

One way of making a reply call that returns a subscriber to the place in the review of messages where the subscriber left off is referred to herein as a "bounce-back" method, which is generally available only from advanced voice mail systems. Such an advanced voice mail system requires the person to call-in for messages, allows a reply call to be made after a particular message, and then allows the person to return to the voice mail service without the person having to make another call into the system. The bounce-back method may be implemented through the use of a platform such as an intelligent peripheral (IP) that maintains control over the person's call into the system and over the reply call. One manner in which to maintain control is to bridge the person's call into the system with the reply call to the caller who left the message. After the reply call is Finished, then the bridge may be torn down, and the person may return to a review of messages or other voice mail functions.

But the manner in which the bounce-back method allows the person to return to the voice mail service without having to make a separate call into the system has drawbacks. Maintaining control over the person's call into the system and the reply call (by making a bridge or otherwise) has the effect of including the platform of the voice mail service as an element in the call path. By remaining an element in the call path, the platform takes up resources of the telecommunications network. In addition, by remaining an element in the call path, the platform may limit, if not eliminate, its own resources to take other calls for the person. Rather than being able to take another call for the person, the platform may be effectively "busy". Whether the resources that are taken up are those of the telecommunications network, the platform, or the voice mail service, the result of the take-up in resources is an increase in cost in at least operation of the platform and service.

Accordingly, there is a need for a solution that allows a person to interrupt a review of messages in a VMS to take some action, and after the interruption, to return to the same place in the review of messages occupied at the time of the interruption without the person having to make a call into the VMS or otherwise to activate the voice mail service, and without an implementing device of the voice mail service being included as an element in the call path during the interruption.

SUMMARY

Generally stated, the present inventions relate to methods and systems for enabling a subscriber to interrupt a review of messages in a voice mail system (VMS) so as to make a call or take some other action such as to make a reply call to one of the messages, and to return to the same position as occupied at the time of the interruption in the VMS. During the interruption, the VMS is not included in the call path with respect to the subscriber's communication. Advantageously, after the interruption, the subscriber may be returned to the same position in the VMS without the subscriber having to make a separate call into the VMS.

More particularly, assume a subscriber is in a review of messages in the VMS and indicates a desire to interrupt the review such as by making a call in response to one of the messages retrieved from the VMS. In response to the indication from the subscriber's communication to leave the review, an identifier is created to mark the position of the subscriber's communication in the review. The identifier is stored in the VMS. The VMS transmits a release message with respect to the subscriber's communication and the message may include a copy of the identifier. The message also may indicate the action to be implemented with respect to the subscriber's communication (such as the routing of a reply call), and may include information related to the action such as the reply telephone number or other information. The message may be a GR-1129 message including a remote operations (RO) parameter with the copy of the identifier and/or other information. The release message effectively removes the VMS from further involvement with the subscriber's communication at least until the subscriber's communication is rerouted to the VMS.

The message from the VMS may be received by the service switching point (SSP) serving the VMS (SSP of VMS), which in turn, routes the message (and/or the information from the message) to a service control point (SCP). In response to the message, the SCP stores the copy of the identifier (if included) and causes whatever action is indicated in the message to be taken with respect to the subscriber's communication.

For example, the SCP may direct the SSP of VMS to route the communication to the subscriber's directory number. A reason for first routing the communication to the subscriber's directory number is to have the communication appear as if it is being made from a line corresponding to the subscriber's directory number. The communication is to appear as if it is being made from the subscriber's directory number for purposes of creating a billing record billing the subscriber, who has elected to make a reply call to a voice mail message.

In the course of routing the subscriber's communication to the subscriber's directory number, the communication typically is routed to the SSP serving the subscriber's directory number (subscriber's SSP). The subscriber's SSP pauses in the processing of the communication and queries the SCP for instructions. The SCP then instructs the subscriber's SSP to take action with respect to the communication. For example, if the action is a reply call to a party who left the subscriber a message, then the action may include routing the communication for termination to an intelligent network element (INE) such as an intelligent peripheral (IP)—The INE is provided with the reply telephone number, and may be provided with a copy of the identifier.

In response to the termination of the subscriber's communication to the INE, the INE initiates an INE call to the reply telephone number. The INE also bridges the subscriber's communication and the INE's call to form the reply call. As a result of the bridge between the subscriber's communication and the INE's call, the subscriber is provided with a reply call to the reply telephone number. Advantageously, the VMS is not involved in this reply call from the subscriber through to the reply number. The release of the VMS from the subscriber's communication frees up the VMS for other calls, reduces use of the infrastructure of the communications network by obviating the connections of the subscriber's communication to the VMS, and otherwise improves the efficiency of processing the reply call.

After the interruption, such as after the disconnection of the reply call, the subscriber may return to a review of messages in trie VMS. The subscriber may return to the VMS without having to make a separate call into the VMS. In addition, the subscriber may be returned to the same position in the review that the subscriber occupied when the interruption occurred.

More particularly, assume as an example that the interruption is a reply call to a message left for the subscriber in the VMS. The subscriber's communication has been bridged with the INE's call to form the call to the reply telephone number. To connect the subscriber for interaction again with the VMS, the reply call is monitored for a disconnect signal such as a disconnect event, the input of particular digits, or the like. The bridge between the subscriber's communication and the INE's call is dismantled so as to disconnect the INE's call to the reply telephone number. The INE may provide a release message to the SSP serving the INE so as to indicate the INE's withdrawal or release from usage with respect to the subscriber's communication. This release message from the INE may include the copy of the identifier.

In response to the release message from the INE, the SSP serving the INE may obtain instructions with respect to the subscriber's communication from the SCP. In the course of obtaining these instructions, the SSP serving the INE may provide the SCP with the copy of the identifier. The query for instructions from the SSP serving the INE may put the SCP on notice mat a network element other than the VMS has released the subscriber's communication. To return the subscriber to the VMS, the SCP provides the SSP serving the MB with directions to route the subscriber's communication to the VMS. The directions may include the copy of the identifier for transmission to the VMS.

The subscriber's communication is routed by the SSP serving the INE to the VMS and may include the copy of the identifier. The VMS uses the copy of the identifier with the identifier to place the subscriber's communication in the same position occupied previously in the review. If the VMS is not provided with the copy of the identifier, the VMS may otherwise access the appropriate identifier for the subscriber's communication (such as through use of the subscriber's directory number, etc.) and use the identifier to place the subscriber's communication in the same position occupied previously in the review.

That the present inventions and the exemplary embodiments accomplish the features of the present inventions will become apparent from the detailed description of the exemplary embodiments and the drawings that follow.

DETAILED DESCRIPTION

The exemplary embodiments of the present inventions provide methods and systems for enabling a subscriber to interrupt a review of messages in a voice mail system (VMS) so as to make a call or take some other action such as to make a reply call to one of the messages, and to return to the same position as occupied at the time of the interruption in the VMS. During the interruption, the VMS is not included in the call path with respect to the subscriber's communication. Advantageously, after the interruption, the subscriber may be returned to the same position in the VMS without the subscriber having to make a separate call into the VMS.

Exemplary Environment for Exemplary Embodiments

The exemplary embodiments of the present inventions are used, preferably, with a region-wide messaging (RWM) system, as described in greater detail below. Nevertheless, the present inventions may be used with any type of messaging system with the appropriate functionality.

The RWM system described herein may allow a subscriber to the messaging system within the region of the service provider to send, receive, forward, and reply to messages, including voice mail messages and Voice Profile for Internet Mail (VPIM) Messages. Subscribers may receive messages from other subscribers and non-subscribers. Subscriber-to-subscriber messaging, however, illustrates the advanced features of the RWM system, which may be available, such as: (1) each subscriber may send a message to another subscriber; (2) each subscriber may reply to a message received from another subscriber; (3) each subscriber may reply to a telephone message received from a non-subscriber by implementing a feature that dials the non-subscriber; and (4) each subscriber may receive and reply to Internet voice messages or fax messages.

Figure 1:
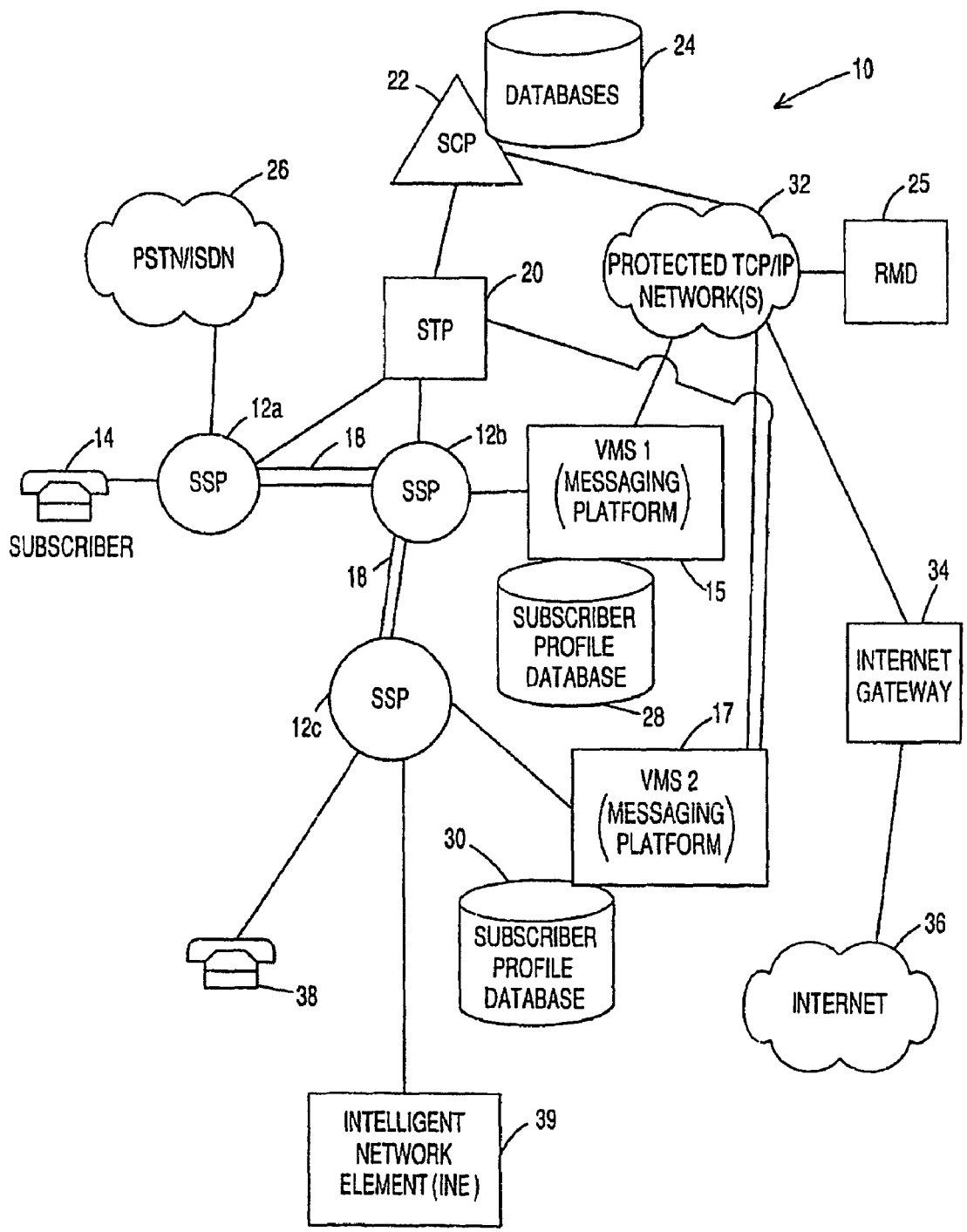
FIG. 1 is a block diagram of an exemplary messaging system such as a region-wide messaging system that may be used in connection with the present inventions.

Exemplary RWM System—FIG. 1

FIG. 1 is a block diagram of an exemplary RWM system 10 (also referred to as a telecommunications messaging network). The network 10 includes a variety of interconnected network elements. A group of such elements includes the plurality of end offices which are indicated as service switching points (SSPs or switches) 12a, 12b, 12c. An SSP typically includes switch functionality, but also includes other functionality so as to communicate with other network elements, and in particular, with Advanced Intelligent Network (AIN) elements. SSP 12a and SSP 12c are each coupled to a subscriber line, which also may be referred to as a line or a calling line. Each SSP 12a, 12b, 12c serves a designated group of lines, and thus, the SSP that serves a particular line may be referred to as its serving switch. The line is typically connected to a piece of terminating equipment including telephones 14, 38. Although telephones 14, 38 are illustrated as the terminating equipment, those skilled in the art will understand that such terminating equipment may include other telecommunications devices including, but not limited to, facsimile machines, computers, modems, etc. End offices may further be coupled through a tandem office (not illustrated), which may be used to connect and switch circuits between and among end offices.

Each active line in an AIN is assigned a ten digit (NPA-NXX-XXXX) line number regardless of whether seven or ten digits are dialed to reach the subscriber. A line number is commonly referred to as a telephone number or a directory number.

SSP 12b is connected by trunks to a voice mail system (VMS) (messaging platform) 15. (These trunks use Signaling System 7 signals for call set-up and other actions.) SSP 12c is connected by trunks to a voice mail system (VMS) (messaging platform) 17.

SSPs 12a, 12b, 12c are interconnected by a plurality of trunk circuits 18. These are the voice path trunks that connect the SSPs to connect communications. In addition to connections to other elements, each of the SSPs is connected to a "local signal transfer point (STP) 20 via respective data links. Currently, these date links employ a signaling protocol referred to as Signaling System 7 (SS7). Much of the intelligence of the AIN resides in a service control point (SCP) 22 that is connected to STP 20 over an SS7 datalink. Among the functions performed by the SCP 22 is the maintenance of network databases and subscriber databases as represented collectively by databases (subscriber data) 24. The system 10 may also include intelligent network elements (INEs) such as the INE 39 illustrated as connected to SSP 12c. An ME may be an intelligent peripheral (IP) such as a service node (SN) (sometimes referred to as a service circuit node). An INE may include voice and dual tone multi-frequency (DTMF) signal recognition devices and voice synthesis devices. The INE. 39 may be connected to the SSP 12c through a data link using an X.25 or other protocol and typically may be connected to one or more SSPs via an Integrated Service Digital Network (ISDN) links.

In order to keep the processing of data and calls as simple as possible, a relatively small set of triggers is defined at the SSPs for each call. A trigger in the AIN is an event associated with a particular call that generates a packet to be sent to an SCP. The SCP queries its databases or service package applications (SPAs) for processing instructions with respect to the particular call. The results are sent back to the SSP in a response from the SCP 22 through STP 20. The return packet includes instructions to the SSP as to how to process the call. The instructions may be to take some special action as a result of a customized calling service or an enhanced feature. In response to the instructions, the SSP moves through the remaining call states, may encounter further triggers, and generates further packets that are used to set up and route the call. Similar devices for routing calls among various local exchange carriers are provided by regional STP (not illustrated) and by regional SCP (not illustrated) which may be connected to STP 20, SCP 22, and/or to the elements described herein through the public switched telephone network (PSTN) 26.

When a messaging subscriber (such as the person or entity using telephone 14) subscribes to a messaging service, an entry or a record is created in a VMS such as VMS 15. Each VMS 15, 17 includes subscriber administration, message retrieval, send, reply, forward, and mailbox maintenance functions, among others. Each VMS 15,17 includes or is functionally connected respectively to a subscriber profile database 28, 30 (subscriber data). Each subscriber profile database stores subscriber-specific profile information (subscriber information) for retrieval by VMS functions. The VMSs 15, 17 are elements of the messaging system or service. To the protected TCP/IP network(s) 32 described below, each of the messaging platforms 15, 17 look like a valid TCP/IP element in support of this, the VMSs 15, 17 may be assigned a TCP/IP (or IP) address and/or a domain name. Generally, the TCP/IP or other address or domain name of the VMS 15, 17 may be stored in a region-wide messaging directory (RMD) 25 discussed below, or may be stored on some domain name server (not illustrated) either in the protected TCP/IP networks) 32, in some other element, or as a separate element. In further support of this TCP/IP capability, the VMSs 15, 17 may also provide operations access to mail administrative destinations, in addition to subscriber messaging mailbox destinations. In addition, each VMS 15 or 17 is an SS7 network element and as such is assigned an identifier such as a directory number, a destination point code (DPC) or the like.

The VMSs 15, 17 communicate with the SSP and the SCP according to the AIN 0.2 Switch—Intelligent Peripheral Interface Generic Requirements—1129-CORE Specification, AINGR: Switch-Intelligent Peripheral Interface (IPI) (A module of AINGR, FR-15); Document Number GR-1129; Issue Number. 03; Updates: REV01-October 1998; Issue Date: September 1997; Product Type: Industry Requirements and Standards (RS); Component of FR-15, ("GR-1129") which is incorporated herein by reference. This GR-1129 describes the use of a Remote Operations (RO) parameter for indicating the invocation of a supplementary service. The RO parameter may be used to allow the SCP 22 and the VMSs 15,17 to share information.

In this messaging service, TCP/IP messaging is allowed via a private Transmission Control Protocol/Internet Protocol (TCP/IP) network (protected TCP/IP networks)) 32. The VMSs 15, 17 through the network 32 may use a Light-weight Directory Access Protocol (LDAP) to communicate with other elements such as a domain name server (not illustrated)

and/or directories such as RMD 25 to obtain information with respect to the proper destination/recipient of a message.

An Internet gateway 34 provides secure access between the private TCP/IP network 32 and the Internet 36. The gateway 34 limits the access of VPIM traffic to and from the Internet 36. In addition, the gateway 34 performs authorized LDAP messaging directory lookups to route messages received from the Internet 36.

Advantageously, a subscriber's line number generally may be the subscriber's mailbox number associated with a messaging platform rendering service to the subscriber in the RWM system. In other words, a message addressed to the subscriber may include the subscriber's line number, which may also be the subscriber's mailbox number. Alternatively, the subscriber's mailbox number may relate to some other identifier associated with the subscriber The subscriber's address may be based on the ten digit directory number (DN) using an International Telecommunications Union (ITV) Standard E. 164 compliant address.

FIG. 1 also illustrates the exemplary use of a region-wide messaging directory 25 (RMD or directory) in the messaging system 10. The RMD 25 is functionally connected to the other elements of the messaging system 10 through inclusion in or a connection to the TCP/IP network 32. Although the RMD 25 is illustrated as connected to the system 10 through the TCP/IP network 32, the RMD 25, or course, may be connected to the system 10 in other ways or even be included in an element of the system such as in association with the directories 24 of SCP 22. An RMD provides high-speed directory look-up for messaging subscribers. Generally, an RMD stores information so as to determine which messaging platform of the RWM system serves which subscriber. Additional information on the manner in which the RMDs of the messaging system 10 store information on messaging platforms and subscribers and how RMDs interact with a network element 51 may be obtained from the commonly assigned and owned patent application entitled "Methods and System for Determining Message Routing Based on Elements of a Directory Number", which was filed with the United States Patent and Trademark Office on Dec. 13, 1999 and assigned Ser. No. 09/459,498, and which was filed with the United States Receiving Office pursuant to the Patent Cooperation Treaty (PCT) on Dec. 13, 1999 and assigned Application No. PCT/US99/29491 and which application is herein by reference.

Of course, an RMD may keep track of other information relating to subscribers of the RWM system. In particular, the RMD may act as both a client and a server with respect to the Light-weight Directory Access Protocol (LDAP). The RMD stores subscriber, service, and other messaging data. In addition, the RMD supports the LDAP attributes field for LDAP clients to choose the fields that they desire to retrieve from the server. Clients may retrieve the subscriber profile from the RMD.

Subscriber data may be stored in the RMD. in the following exemplary fashion:

| Description/Directory Field | LDAP DN Attribute |
| --- | --- |
| Subscriber's Mailbox Number | CN (Common Name) |
| Name Announcement | Spoken Name |
| MDSBlocking | N/A |

Subscriber data is used to look up subscribers in the RMD. The data is also used for the purposes of routing and billing a subscriber's calls and messages to and from the messaging platforms.

Service data may be stored in the RMD in the following exemplary fashion:

| Description/Directory Field | LDAP DN Attribute |
| --- | --- |
| VMS ID | VMSID |
| VMS DAP Number | VMSDN |
| VMS Domain | Domain |
| VoiceEncoding | N/A |
| LATA | N/A |
| State | N/A |
| StateLATA | N/A |
| LDAP Credentials | Hidden in LDAP query |
| VMS IP address | Hidden in LDAP query |

The service data contains messaging platform-specific information to perform checks during directory look-up and call/message routing. The RMD may also store service provider data to ensure that a service provider has access to only its authorized subscribers' information.

Figure 2:
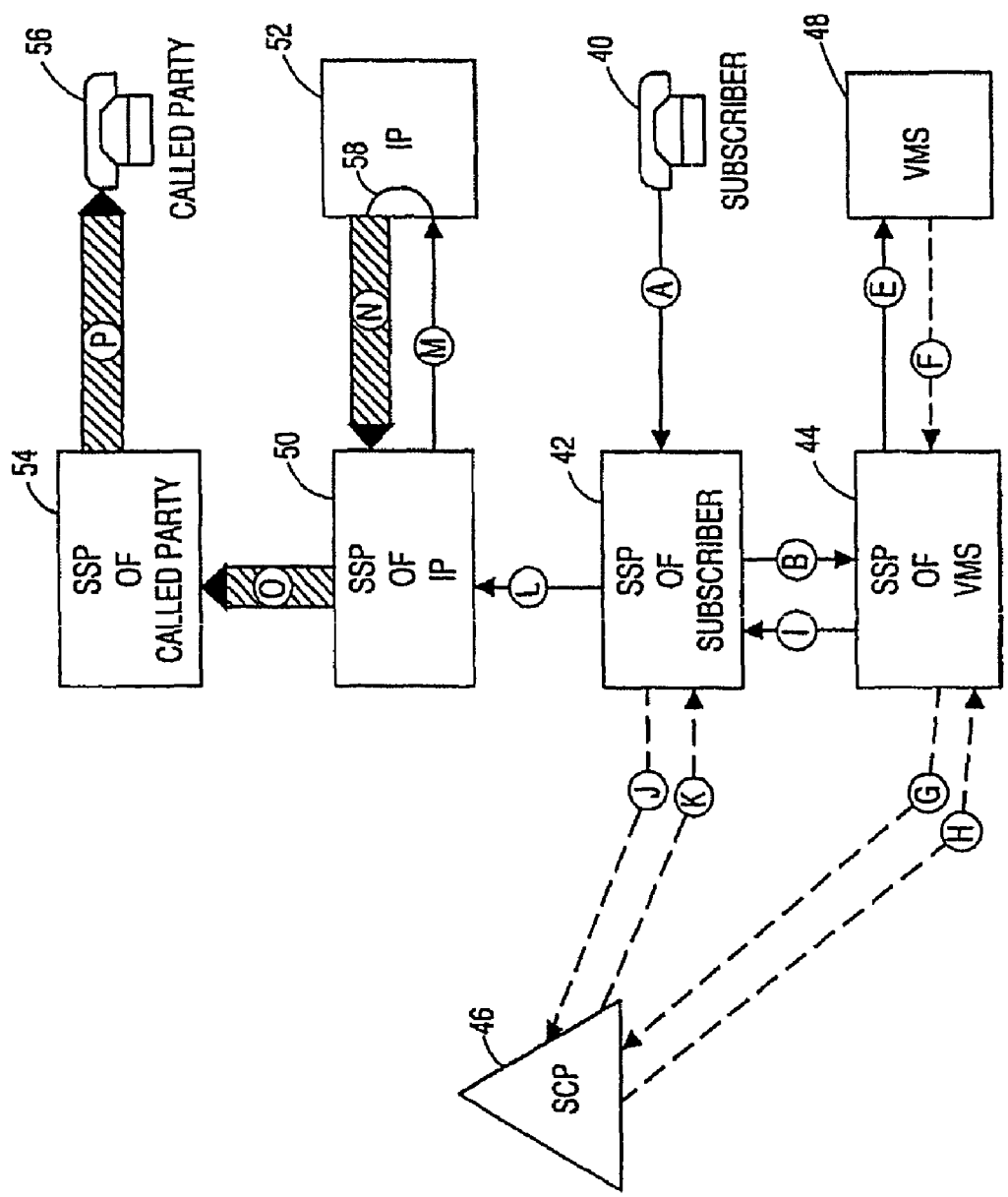
FIG. 2 is a block diagram illustrating an exemplary reply call from the subscriber to the reply telephone number without the involvement of the VMS in the reply call.

Exemplary Reply Call with an Identifier Marking the Subscriber's Position—FIG. 2 and FIG. 1

FIG. 2 is a block diagram illustrating an exemplary reply call from the subscriber to a reply telephone number without the involvement of the VMS in the reply call. Additional information on reply calls such as the exemplary reply call described in connection with FIG. 2 may be found in the commonly assigned and owned patent application entitled "Methods and Systems for Enabling a Reply Call to a Voice Mail Message", filed on Feb. 25, 2000 with the United States Patent and Trademark Office and assigned Ser. No. 09/513,004 and with the United States Patent and Trademark Office as the receiving office pursuant to the Patent Cooperation Treaty (PCT) and assigned Serial Number PCTUS00/04766 and incorporated herein by reference.

Referring to FIG. 2, assume for this example that a subscriber 40 has called the VMS 48 to retrieve messages. During the retrieval, the subscriber 40 interrupts to take action on a message by placing a reply call. After the reply call, the subscriber desires to return to the position in the review of messages where he or she left off at the time of the interruption. In the figures, solid arrows and cross-hatched arrows illustrate the call path of communication. Dashed arrows illustrate the paths between or among elements in the exchange of data or control signals.

Subscriber 40 dials a "pilot" or "administration" number, which also may be referred to as a messaging access telephone number. As indicated by solid arrow A, the subscriber's communication is routed to the service switching point serving the subscriber ("subscriber's SSP") 42. As indicated by solid arrow B, the subscriber's SSP routes the subscriber's communication to the SSP serving the VMS ("SSP of the VMS") 44. The communication encounters a trigger provisioned on the SSP of the VMS 44 with respect to the pilot number. The SSP of the VMS 44 engages in a query/response exchange (not illustrated in FIG. 2) with an SCP 46 and is provided with instructions to route the communication to the VMS 48. As indicated by solid arrow E, the SSP of the VMS 44 routes the subscriber's communication to the VMS 48. The VMS 48 uses the calling number (i.e., the subscriber's directory number) to access the subscriber's voice mailbox and to make any message available to the subscriber.

Thus, the call path of the subscriber's communication to retrieve his or her voice mail messages from the VMS 48 is illustrated by the solid arrows A, B, and E of FIG. 2. In particular, the call path is from: the subscriber's equipment 40 to the subscriber's SSP 42 (arrow A); the subscriber's SSP 42 to the SSP of the VMS 44 (arrow B); and then the SSP of the VMS 44 to the VMS 48 (arrow E).

When the subscriber 40 calls into the VMS 48 to retrieve messages, the VMS 48 may keep track of the position of the subscriber's communication with respect to the retrieval of the messages. The VMS 48 may keep track of the position (and related information) through the use of a table or other device. The VMS 48 may present the subscriber 40 (visually on a display or by announcement) with his or her position in the retrieval of messages.

Figure 3:
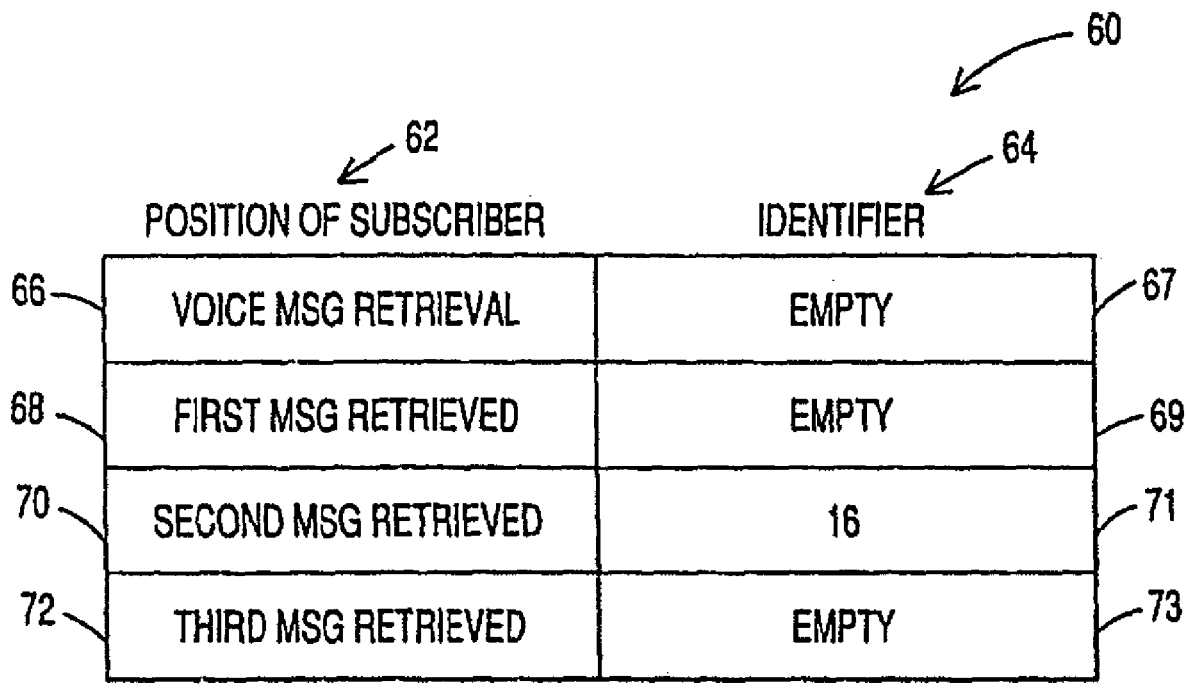
FIG. 3 illustrates an exemplary table 60 such as may be used in connection with the retrieval of messages in the exemplary embodiments.

FIG. 3 illustrates an exemplary table 60 such as may be used by the VMS 48 and/or presented to the subscriber 40 in connection with the retrieval of messages. The table 60 includes two columns: the left "position" column 62; and the right "identifier" column 64. Each column includes entries that correspond row by row alignment to the entries of the other column. The position column 62 includes entries which indicate the position of the subscriber in the voice mail service. The identifier column 64 provides a respective identifier in each of its entries to correspond to the appropriate entry in the position column Prior to a functional description of the table 60, details are now provided about the entries 66-73 in the table. As the first row in the table 60, the highest level in message retrieval of the position column 62 is the entry 66 entitled "voice message retrieval". The corresponding entry 67 in the identifier column 64 is marked "empty". As the second row in the table 60, the entry 68 of the position column 62 is entitled "first message retrieved". The corresponding entry 69 in the identifier column 64 is marked "empty". As the third row in the table 60, the entry 70 of the position column 62 is entitled "second message retrieved". The corresponding entry 71 in the identifier column 64 is marked "16". As the fourth row in the table 60, the entry 70 of the position column 62 is entitled "third message retrieved". The corresponding entry 73 is marked "empty".

One feature of the exemplary embodiments that this table 60 illustrates is that a subscriber may interrupt a review of messages at any point. In this example, the subscriber has decided to interrupt a review of messages in the VMS 48 to make a reply call (a "live call") to a called party who left him or her the second voice mail message. To indicate that the subscriber desires to make a reply call to a particular voice mail message, he or she provides some indication to the VMS 48 such as the input of a particular code. Generally, the code may be input by the subscriber while the subscriber is listening or reviewing the particular message, or after the end of the particular message. The subscriber may input this code and make a reply call to a message even though other messages are awaiting review by the subscriber. In sum, the subscriber does not have to wait until all of the messages have been reviewed or otherwise reach the end of the accumulated messages in order to make a reply call to a particular message.

The VMS 48 notes the receipt of the indication [AudioDTMF[nn]] that the subscriber desires to make a reply call to a message, and in this example, to the second message. The VMS 48 creates and stores an identifier to correspond to the second message. Referring to table 60, entry 70 entitled "second message retrieved" in the position column 62 is the relevant entry, and its corresponding entry 71 in the "identifier" column is filled with an identifier marked "16" in this example. The identifier also may be referred to as a bookmark, an access number or code, or the like. For the identifier, the exemplary VMS 48 selects an integer ("16") from a pool of integers available for use as identifiers. The VMS 48 stores the identifier in the table 60 (or in another device or area) so that the identifier corresponds to the menu level of the subscriber's communication in review of messages ("second message retrieved" in this example).

Now referring again to FIG. 2, also in response to the receipt of the indication that the subscriber desires to make a reply call to a message, as indicated by dashed arrow F, the VMS 48 sends an ISUP Release (ISUP REL) message to the SSP of the VMS 44.

The message is a release of the subscriber's communication by the VMS 44. The message may be a GR-1129 message and may include a remote operations (RO) parameter with fields: (1) an identifier for implementation of a reply call (which may be characterized as an identifier of an operation type and abbreviated as "OperType"); (2) a destination number (DestNumber) for the reply call which may be referred to as the reply telephone number (which may be included by the VMS as taken from the information associated with the message to which the subscriber is making the reply call); (3) a subscriber number that identifies the subscriber with respect to his or her mailbox and/or for billing purposes; and (4) a copy of the identifier (i.e., the "16" entry) corresponding to the subscriber's position in the review of messages in the VMS. The release message effectively removes the VMS 48 from further involvement with the subscriber's communication or with the reply call (at least until the subscriber's communication is returned to the VMS 48).

The message from the VMS 48 is received by the SSP of the VMS 44, which, in turn, transmits a TCAP Resource_Clear (TCAPResClear) message to the SCP 46 as indicated by dashed arrow G. The message from the SSP of the VMS 44 to the SCP 46 may include the message from the VMS 48 or the relevant parts thereof such as identification of the operation to be implemented (i.e., reply call), the reply telephone number, the subscriber's directory number, and a copy of the identifier marking the position of the subscriber's communication in the review of messages in the VMS.

In response to receipt of the message from the SSP of the VMS 44, the SCP 46 analyzes the message and determines that an operation is to be implemented with respect to the subscriber's communication. In this example, the operation to be implemented is a reply call and the reply call is to be made to the called party number. Accordingly, the SCP 46, as indicated by dashed arrow H, sends a TCAP Analyze_Route (TCAPAnalRte) message to the SSP of the VMS 44, which instructs the SSP of the VMS 44 to route the subscriber's communication to the subscriber's directory number. The message from the SCP 46 sets the called number to the subscriber's directory number. The SCP 46 also includes at least the reply telephone number (for example, as the redirecting number) and may include the other information from the RO parameter in its message to the SSP of the VMS 44 such as the copy of the identifier marking the subscriber's position in the review of messages in the VMS.

As noted, the SCP 46 directs the SSP of the VMS 44 to route the subscriber's communication to the subscriber's directory number. A reason for first routing the communication to the subscriber's directory number is to have the communication appear as if it is being made from a line corresponding to the subscriber's directory number. The communication is to appear as if it is being made from the subscriber's directory number for purposes of creating a billing record billing the subscriber, who has elected to make a reply call to a voice mail message. Of course, if there is no reason to route the communication first to the subscriber's directory number, then the communication may be routed directly to the reply telephone number.

The SSP of the VMS 44 uses an ISUP message in routing the communication to the subscriber's directory number. The ISUP message may include a copy of the identifier marking the position of the subscriber's communication in the review of messages in the VMS 48. In the course of the routing, the communication is directed to the SSP serving the subscriber's directory number (subscriber's SSP) 42, where a termination attempt (TAT) trigger is encountered with respect to, the subscriber's directory number. The subscriber's SSP 42 pauses in the processing of the communication and queries the SCP 46 for instructions by using a TCAP termination attempt (TCAP TermAttempt) message. The message from the subscriber's SSP 42 may include the message or the relevant information from the message (i.e., the RO parameter information) relating to the reply call such as provided by the VMS 48 and including an identifier for the operation to be implemented, the reply telephone number, the subscriber's directory number, and a copy of the identifier marking the position of the subscriber's communication in the review of messages in the VMS. The transmission of the query from the subscriber's SSP 42 to the SCP 46 is illustrated in FIG. 3 by the dashed arrow J.

The SCP 46 examines the information received in the TCAP TermAttempt message, and determines that the communication is an outdial call. The SCP 46 then uses a TCAP Forward_Call message, as indicated by dashed arrow K, to instruct the subscriber's SSP 42 to route the communication for termination to an intelligent network element (INE) such as an intelligent peripheral (IP) 52. The instructions may include a copy of the identifier marking the position of the subscriber's communication in the review of messages in the VMS.

As indicated by solid arrow L, the subscriber's SSP 42 routes the subscriber's communication to the SSP of the IP 50 and may include a copy of the identifier marking the position of the subscriber's communication in the review of the messages in the VMS. The subscriber's SSP 42 uses an ISUP IAM message with the called number as the directory number of the IP 52 and may include the information of the RO parameter. As indicated by solid arrow M, the SSP of the IP 50 then terminates the subscriber's communication to the IP 52. The SSP of the IP 50 uses a PRI Setup message and may include the information of the RO parameter including a copy of the identifier marking the position of the subscriber's communication in the review of messages in the VMS.

At this point in the implementation of the reply call to the message as indicated by the subscriber, the call path of the subscriber's communication does not include the VMS 48. In particular, at this point, the call path is illustrated in FIG. 2 as from: the subscriber's equipment 40 to the subscriber's SSP 42 (arrow A); the subscriber's SSP 42 to the SSP of the IP 50 (arrow L); and the SSP of the IP 50 to the IP 52 (arrow M). (In some cases, the call path also may include the SSP of the VMS 44).

In response to the termination of the subscriber's communication to the IP 52, the IP 52 initiates a call to the reply telephone number ("IP's call"). The IP's call is initially routed from the IP 52 to the SSP of the IP 50 as indicated by cross-hatched arrow N and uses a PRI Setup message. From the SSP of the IP 50, the IP's call is routed, as illustrated by cross-hatched arrow O, to the SSP serving the reply telephone number ("called party's SSP") 54. The called party's SSP 54 further routes the IP's call to the equipment of the called party 56 as indicated by cross-hatched arrow P. Thus, the call path of the IP's call is from: the IP 52 to the SSP of the IP 50 (arrow N); the SSP of the IP 50 to the called party's SSP 54 (arrow O); and the called party's SSP 54 to the called party 56 (arrow P).

In addition, the IP 52 connects or merges the subscriber's communication and the IPs call such as by making a bridge 58, or otherwise, to form the reply call. As a result of the bridge 58 between the subscriber's communication and the IP's call, the subscriber is provided with a reply call to the reply telephone number.

Advantageously, the VMS 48 is not involved in this reply call from the subscriber through to the reply number. The release of the VMS 48 from the subscriber's communication frees up the VMS 48 for other calls, reduces use of the infrastructure of the communications network by obviating the connections of the subscriber's communication to the VMS 48, and otherwise improves the efficiency of processing the reply call.

Figure 4:
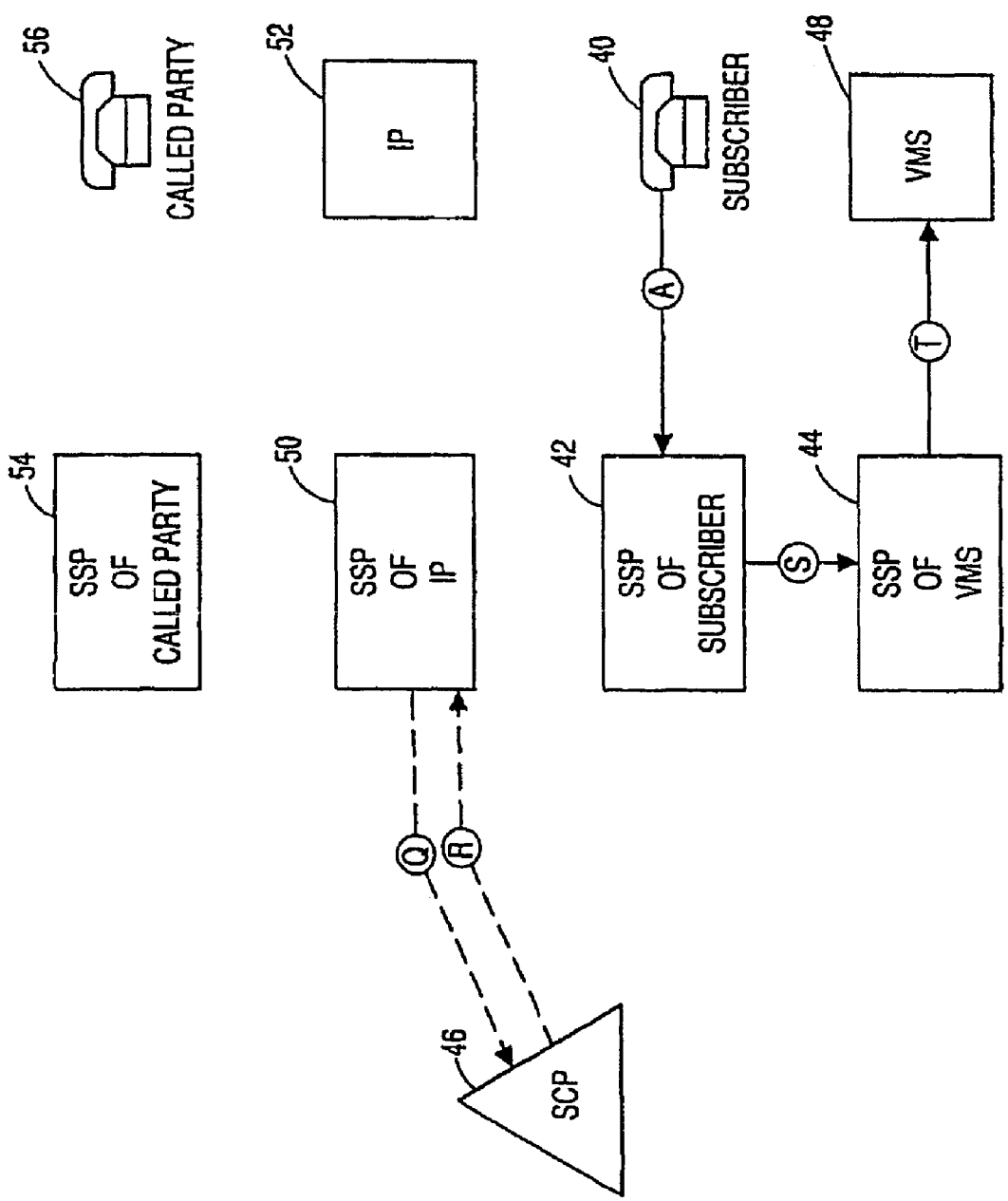
FIG. 4 is a block diagram illustrating an exemplary connection of the subscriber's communication for interaction with the VMS after the disconnection of the reply call and without the subscriber having to call back into the VMS.

Exemplary Connection for Interaction with the VMS—FIG. 4

An advantage of the present inventions is that they provide methods and systems to connect the subscriber to the VMS 48 for interaction with the VMS 48 after an interruption in the retrieval of messages without the subscriber having to make a separate call into the VMS and by placing the subscriber in the position in the review of messages at the point where the subscriber left off for the interruption.

Generally, to connect the subscriber for interaction again (after a reply call or similar interruption) with the VMS 48, the reply call is monitored by the IP 52 for a disconnect signal such as a disconnect event, the input of particular digits, or the like [AudioDTMF "*"]. In response to a disconnect signal, the IP 52 disconnects the called party 56 so as to disconnect the IP's call. The bridge between the subscriber's communication and the IP's call, is dismantled so that only, the subscriber's communication remains. The IP 52 releases the subscriber's communication, which is routed to the VMS 48.

FIG. 4 illustrates the exemplary environment of FIG. 3, but after the IP 52 has received a disconnect signal and has disconnected the called party, and only the subscriber's communication remains. Unlike FIG. 3, there is no call path from the IP 52 to the SSP of the IP 50, nor a call path from the SSP of the IP 50 to the called party's SSP 54, and no calf path from the called party's SSP 54 to the called party 56.

Once the IP 52 disconnects the IP's call, the IP 52 sends an ISUP Release (ISUP) message to the SSP of the IP 50. This message may include a copy of the identifier marking the position of the subscriber's communication in the review of messages in the VMS. The SSP of the IP 50 obtains instructions in a query/response exchange from the SCP 46 with respect to the subscriber's communication (dashed arrows Q and R). In the query, the SSP of the IP 50 may provide a copy of the identifier marking the position of the subscriber's communication in the review of the messages in the VMS. In the response, the SCP 46 may provide a copy of the identifier marking the position of the subscriber's communication in the review of the messages in the VMS. In particular, the subscriber's communication is processed so as to route the communication to the VMS 48 without the subscriber having to call back into the VMS.

The subscriber's communication is routed by the SSP of the IP 50 to the directory number of the VMS 48. Solid arrow S from the subscriber's SSP 42 to the SSP of the VMS 44 and solid arrow T from the SSP of the VMS 44 to the VMS. 48 (as well as arrow A from the subscriber 40 to the subscriber's SSP 42) illustrate that the call path of the subscriber's communication has been returned to that illustrated by arrows A, B, and E of FIG. 2 when the subscriber 40 was in communication with the VMS 48. In the course of this routing of the subscriber's communication, the VMS may be provided with a copy of the identifier marking the position of the subscriber's communication in the review of the messages in the VMS. Advantageously, the subscriber does not have to make a call back into the VMS 48 to continue to interact with the VMS 48, but the subscriber may simply hang on after disconnection of the reply call to be routed back to the VMS 48.

In response to receipt of the subscriber's communication, the VMS 48 places the subscriber's communication in the same position occupied previously in the review (i.e., before the interruption). The VMS 48 may accomplish this placement by using the copy of the identifier with the identifier the VMS 48 has stored with respect to this subscriber and/or to this subscriber's communication. The copy of the identifier may be compared for a match to the entries in the identifier column of the table 60 of the subscriber's communication. If the VMS is not provided with the copy of the identifier, the VMS may otherwise access the appropriate identifier for the subscriber's communication (such as through use of the subscriber's directory number, etc.) and use the identifier to place the subscriber's communication in the same position occupied previously in the review.

Once the VMS has used the identifier to place the subscriber's communication in position, the VMS 48 may delete or otherwise eliminate the identifier from its entry in the table 60 of the subscriber's communication. The identifier may be returned to the "pool of identifiers" for reuse.

Alternative Embodiments

The exemplary embodiments described above are related to use in a messaging system such as a voice mail system. Nonetheless, the present inventions may be implemented in other contexts. For example, rather than returning a subscriber to a previous position in the retrieval of messages, the present inventions may be used in connection with returning a user to a particular place in the review of other matter such as documents, audio messages, videos, music, educational or commercial programs or materials, and the like.

An example of such an alternative use is in connection with a customer who accesses materials relating to a product the customer is interested in purchasing. The present inventions may be used to allow the customer to interrupt his or her review of the product materials, and then after the interruption, to return to the position occupied in the product materials prior to the interruption. Advantageously, the customer (and the product vendor) is assured that the customer does not miss anything in the product material, but still is able to take a break from review of the product material.

Another alternative use is in connection with the review of a compilation of songs by a potential customer. The customer may be engaged in reviewing the compilation track-by-track, but then be interrupted for some reason. Using the present inventions, after the interruption, the customer may be returned to the track of the compilation which he or she was reviewing at the time of the interruption.

CONCLUSION

From the foregoing description of the exemplary embodiments of the present inventions and operations thereof, other embodiments will suggest themselves to those skilled in the art. Therefore, the scope of the present invention is to be limited only by the claims below and equivalents thereof:

What is claimed is:

1. A tangible non-transitory computer readable medium comprising:
    a processor; and
    a memory component, configured to store logic configured to:
        receive at least one recorded messages, at a voice mail server;
        receive a subscriber communication to review the at least one recorded messages;
        receive a subscriber indication to leave a review of recorded messages in the voice mail server;
        create an identifier to mark a position of the subscriber communication in the review of recorded messages in the voice mail server,
        wherein creating the identifier to mark the position of the subscriber communication includes, in response to receiving the indication from the subscriber communication to leave the review, providing a message indicating a release of the subscriber's communication,
        wherein the message includes a remote operations parameter including a copy of the identifier and wherein the message comprises a GR-1129 message comprising the remote operations parameter including the copy of the identifier; and
        in response to receiving a notice indicating the subscriber communication is to rejoin the review of recorded messages in the voice mail server, using the identifier to place the subscriber communication in the position in the review of recorded messages in the voice mail server,
        wherein a subscriber may interrupt the review of messages in the voice mail server to initiate a new communication and then return to the position in the review of recorded messages in the voice mail server.

2. The computer readable medium of claim 1, the memory component further comprising logic configured to:
    receive the notice,
    wherein the notice includes the copy of the identifier, and
    wherein using the identifier to place the subscriber communication in the position in the review of recorded messages includes using the copy of the identifier to place the subscriber communication in the position in the review of recorded messages.

3. The tangible non-transitory computer readable medium of claim 1, the memory component further comprising logic configured to transmit the identifier after creating the identifier.

4. The tangible non-transitory computer readable medium of claim 1, wherein the received notice is generated by a non-terminating network element.

* * * * *